United States Patent
Su et al.

(10) Patent No.: US 11,018,236 B2
(45) Date of Patent: May 25, 2021

(54) THIN FILM TRANSISTOR, ARRAY SUBSTRATE, DISPLAY PANEL AND METHOD FOR MANUFACTURING THIN FILM TRANSISTOR

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tongshang Su, Beijing (CN); Dongfang Wang, Beijing (CN); Ce Zhao, Beijing (CN); Bin Zhou, Beijing (CN); Liangchen Yan, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/397,386

(22) Filed: Apr. 29, 2019

(65) Prior Publication Data

US 2020/0013867 A1    Jan. 9, 2020

(30) Foreign Application Priority Data

Jul. 3, 2018 (CN) .......................... 201810717745.8

(51) Int. Cl.
  *H01L 29/45* (2006.01)
  *G03F 7/16* (2006.01)
  (Continued)

(52) U.S. Cl.
  CPC .............. *H01L 29/45* (2013.01); *G03F 7/16* (2013.01); *G03F 7/168* (2013.01); *G03F 7/2002* (2013.01);
  (Continued)

(58) Field of Classification Search
  CPC . H01L 29/45; H01L 21/02565; H01L 21/441; H01L 21/467; H01L 21/47635;
  (Continued)

(56) References Cited

U.S. PATENT DOCUMENTS

| 2014/0159037 A1 | 6/2014 | Kwon et al. |
| 2015/0206980 A1 | 7/2015 | Lee |

(Continued)

FOREIGN PATENT DOCUMENTS

| CN | 104854706 A | 8/2015 |
| CN | 105932067 A | 9/2016 |

(Continued)

OTHER PUBLICATIONS

First Office Action and English language translation, CN Application No. 201810717745.8, dated Sep. 29, 2019, 20 pp.

(Continued)

*Primary Examiner* — Patricia D Reddington
(74) *Attorney, Agent, or Firm* — Myers Bigel, P.A.

(57) ABSTRACT

The present disclosure provides a thin film transistor, including a base substrate, an active layer and a source/drain, and a conductive layer. The active layer and an outer edge of the conductive layer are formed in the same etching process. The present disclosure further provides a method for manufacturing a thin film transistor, including forming an active material layer and a conductive material layer, forming a photoresist on the conductive material layer, exposing and developing the photoresist by means of a halftone mask, removing segments of the active material layer and the conductive material layer corresponding to a photoresist completely-removed region by a same etching process, partially removing the photoresist in a photoresist completely-retained region and completely removing the photoresist in a photoresist partially-retained region, and remov- (Continued)

ing a segment of the conductive material layer corresponding to the photoresist partially-retained region.

8 Claims, 3 Drawing Sheets

(51) Int. Cl.
| | |
|---|---|
| *G03F 7/20* | (2006.01) |
| *G03F 7/26* | (2006.01) |
| *H01L 21/02* | (2006.01) |
| *H01L 21/441* | (2006.01) |
| *H01L 21/467* | (2006.01) |
| *H01L 21/4763* | (2006.01) |
| *H01L 27/12* | (2006.01) |
| *H01L 29/24* | (2006.01) |
| *H01L 29/66* | (2006.01) |
| *H01L 29/786* | (2006.01) |
| *H01L 21/027* | (2006.01) |

(52) U.S. Cl.
CPC ............ *G03F 7/2024* (2013.01); *G03F 7/26* (2013.01); *H01L 21/02565* (2013.01); *H01L 21/441* (2013.01); *H01L 21/467* (2013.01); *H01L 21/47635* (2013.01); *H01L 27/127* (2013.01); *H01L 27/1225* (2013.01); *H01L 27/1288* (2013.01); *H01L 29/24* (2013.01); *H01L 29/66969* (2013.01); *H01L 29/7869* (2013.01); *H01L 29/78618* (2013.01); *H01L 29/78633* (2013.01); *H01L 21/02068* (2013.01); *H01L 21/0274* (2013.01)

(58) Field of Classification Search
CPC ............... H01L 27/1225; H01L 27/127; H01L 27/1288; H01L 29/24; H01L 29/66969; H01L 29/78618; H01L 29/78633; H01L 29/7869; H01L 29/41733; H01L 27/1214; H01L 21/02068; H01L 21/0274; G03F 7/16; G03F 7/168; G03F 7/2002; G03F 7/2024; G03F 7/26
See application file for complete search history.

(56) References Cited

U.S. PATENT DOCUMENTS

| | | | |
|---|---|---|---|
| 2016/0020227 A1* | 1/2016 | Choi | ...................... G02F 1/1362 257/43 |
| 2017/0033237 A1* | 2/2017 | Abe | ..................... H01L 27/1225 |
| 2018/0182865 A1 | 6/2018 | Hao et al. | |
| 2019/0172953 A1 | 6/2019 | Ding et al. | |

FOREIGN PATENT DOCUMENTS

| | | |
|---|---|---|
| CN | 106328586 A | 1/2017 |
| CN | 107808826 A | 3/2018 |
| CN | 107994066 A | 5/2018 |

OTHER PUBLICATIONS

Second Office Action and English language translation, CN Application No. 201810717745.8, dated Jun. 23, 2020, 19 pp.

* cited by examiner

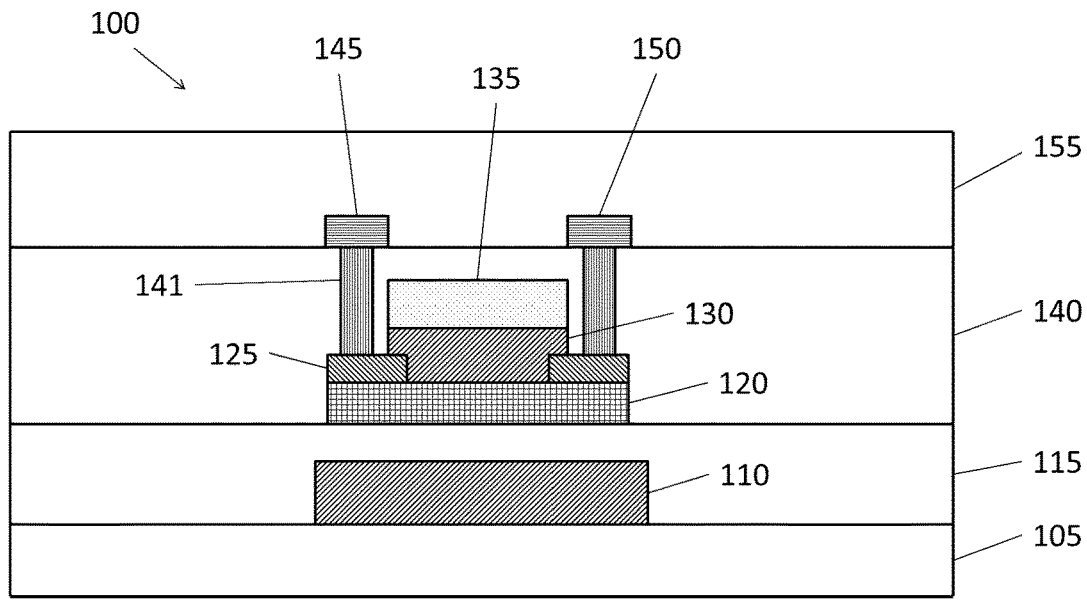

| S205 | forming active material layer, and forming conductive material layer on active material layer |
| S210 | forming photoresist on conductive material layer |
| S215 | exposing and developing photoresist by halftone mask such that photoresist is divided into photoresist completely-removed region, photoresist completely-retained region, and photoresist partially-retained region |
| S220 | removing segment of active material layer and segment of conductive material layer corresponding to photoresist completely-removed region by same etching process, to form stack of active layer and patterned conductive material layer |
| S225 | partially removing photoresist in photoresist completely-retained region and completely removing photoresist in photoresist partially-retained region |
| S230 | removing segment of conductive material layer corresponding to photoresist partially-retained region, to form conductive layer |

FIG. 2

THIN FILM TRANSISTOR, ARRAY SUBSTRATE, DISPLAY PANEL AND METHOD FOR MANUFACTURING THIN FILM TRANSISTOR

CROSS REFERENCE TO RELATED APPLICATIONS

The present application claims the benefit of Chinese Patent Application No. 201810717745.8 filed on Jul. 3, 2018, the content of which is incorporated herein by reference in its entirety.

FIELD

The present disclosure relates to the field of display technologies, and in particular, to a thin film transistor, an array substrate, a display panel and a method for manufacturing a thin film transistor.

BACKGROUND

Oxide thin film transistor is currently widely used in display panels.

SUMMARY

According to an aspect of the present application, there is provided a thin film transistor, comprising a base substrate, an active layer and a source/drain arranged on the base substrate, and a conductive layer arranged directly on the active layer and electrically connected to the source/drain. The active layer and an outer edge of the conductive layer are formed in a same etching process.

In some embodiments, a work function of a conductive material comprised by the conductive layer matches a work function of an active material comprised by the active layer.

In some embodiments, the conductive material comprises ITO or IZO, and the active material comprises IGZO or ITZO.

In some embodiments, an orthographic projection of the conductive layer on the base substrate is within an orthographic projection of the active layer on the base substrate.

In some embodiments, the active layer, the conductive layer, a gate, and the source/drain are sequentially arranged in a direction away from the base substrate.

According to another aspect of the present application, there is provided an array substrate, comprising the thin film transistor according to an embodiment of the present disclosure.

According to yet another aspect of the present application, there is provided a display panel, comprising the array substrate according to an embodiment of the present disclosure.

According to still another aspect of the present application, there is provided a method for manufacturing a thin film transistor, comprising the steps of:

forming an active material layer, and forming a conductive material layer on the active material layer, forming a photoresist on the conductive material layer, exposing and developing the photoresist by means of a halftone mask such that the photoresist is divided into a photoresist completely-removed region, a photoresist completely-retained region, and a photoresist partially-retained region, removing a segment of the active material layer and a segment of the conductive material layer corresponding to the photoresist completely-removed region by a same etching process, to form a stack of an active layer and a patterned conductive material layer, partially removing the photoresist in the photoresist completely-retained region and completely removing the photoresist in the photoresist partially-retained region, and removing a segment of the conductive material layer corresponding to the photoresist partially-retained region, to form a conductive layer.

In some embodiments, the step of removing the segment of the active material layer and the segment of the conductive material layer corresponding to the photoresist completely-removed region by the same etching process, to form the stack of the active layer and the patterned conductive material layer comprises:

etching the segment of the active material layer and the segment of the conductive material layer corresponding to the photoresist completely-removed region by a wet etching process.

In some embodiments, the step of removing the segment of the active material layer and the segment of the conductive material layer corresponding to the photoresist completely-removed region by the same etching process, to form the stack of the active layer and the patterned conductive material layer comprises:

etching the active material layer and the conductive material layer by using a same etching solution.

In some embodiments, an active material comprised by the active material layer comprises IGZO or ITZO, and a conductive material comprised by the conductive material layer comprises ITO or IZO.

In some embodiments, the step of partially removing the photoresist in the photoresist completely-retained region and completely removing the photoresist in the photoresist partially-retained region comprises:

illuminating and developing the photoresist completely-retained region and the photoresist partially-retained region, such that the photoresist in the photoresist partially-retained region is completely removed and the photoresist in the photoresist completely-retained region is partially removed in a direction perpendicular to the active material layer.

In some embodiments, the step of removing the segment of the conductive material layer corresponding to the photoresist partially-retained region, to form the conductive layer comprises:

etching the segment of the conductive material layer corresponding to the photoresist partially-retained region by a wet etching process.

In some embodiments, the step of removing the segment of the active material layer and the segment of the conductive material layer corresponding to the photoresist completely-removed region by the same etching process to form the stack of the active layer and the patterned conductive material layer and the step of removing the segment of the conductive material layer corresponding to the photoresist partially-retained region to form the conductive layer use a same etching material.

In some embodiments, the method for manufacturing the thin film transistor further comprises:

removing the photoresist in the photoresist completely-retained region.

BRIEF DESCRIPTION OF DRAWINGS

FIG. 1 schematically shows a structure of a thin film transistor according to an embodiment of the present disclosure, FIG. 2 schematically shows a flowchart of a method for manufacturing a thin film transistor according to an embodiment of the present disclosure, and FIG. 3-10 schematically show intermediate structures of a thin film transistor in the process of the method for manufacturing the thin film transistor according to an embodiment of the present disclosure.

DETAILED DESCRIPTION

Figure 3:
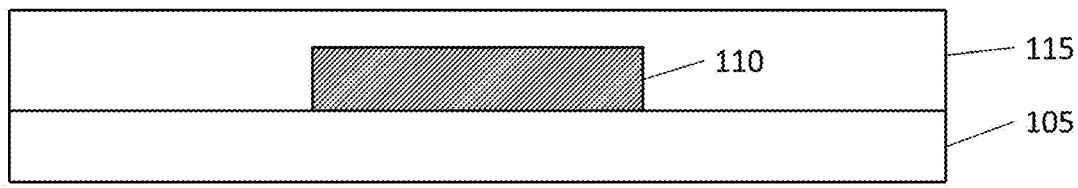

Embodiments of the present disclosure will now be described in more detail below with reference to the drawings. However, it should be understood that the present disclosure may be embodied in many different forms and is not limited to the embodiments described herein; rather, these embodiments are merely illustrative. The same reference numerals in the drawings refer to the same elements throughout.

Oxide thin film transistor is widely used in display panels because of its high mobility, good uniformity, and high visible light transmittance. A common thin film transistor comprises structures such as a source/drain, a gate and an active layer, etc., and the source and the drain are electrically connected to the active layer, respectively. In order to reduce the resistance of the contact between the source/drain (or the material connecting the source/drain and the active layer) and the active layer, usually, after the active layer is formed, a part of the active layer that is to be electrically connected to the source/drain is converted into an electrically conductive region by using the He plasma. The work function of the electrically conductive region is matched to the work function of the source/drain, so that the resistance of the contact is relatively small. In the active layer, there is a channel region between the electrically conductive regions. When the parts of the active layer are converted into the electrically conductive regions by means of the He plasma, the carrier concentration in the electrically conductive regions increases sharply because of the bombardment of the helium ions to the parts of the active layer beside the channel region. These carriers diffuse into the channel region, making the channel length shorter. However, because of the uncertainty of the converting process and carrier diffusion, the channel length of each thin film transistor may be inconsistent. This may affect the uniformity of the gate threshold voltage ($V_{th}$) of each thin film transistor of the display panel, thereby degrading the display quality of the display panel. In addition, if a dry etching process is applied during the manufacturing of the thin film transistor, the above-mentioned channel length inconsistency may also be caused.

In order to at least solve the above problems, embodiments of the present disclosure provide a thin film transistor. FIG. 1 schematically shows a cross-sectional view of a structure of a thin film transistor 100 according to an embodiment of the present disclosure. The thin film transistor 100 comprises a base substrate 105, an active layer 120 and a source/drain 145, 150 disposed on the base substrate 105, and a conductive layer 125 disposed directly on the active layer 120 and electrically connected to the source/drain 145, 150. The active layer 120 comprises an active material and the conductive layer 125 comprises a conductive material. In an embodiment, the work function of the conductive material matches the work function of the active material. By "match" is meant that the work function of the conductive material is close to the work function of the active material, such that an ohmic contact can be formed between the two materials, thereby reducing the resistance of the electrical connection between the two materials. The conductive layer 125 can enhance the electrical connection between the active layer 120 and the source/drain 145, 150 without performing the above mentioned converting process to the active layer 120. Therefore, while maintaining the electrical characteristics between the active layer 120 and the source/drain 145, 150, the disadvantage of the channel length difference caused by the converting process is overcome, so that the problem of the uniformity of the gate threshold voltage $V_{th}$ is solved.

In an embodiment, the conductive layer 125 is disposed over active layer 120. In this case, a portion of the outer edge of the orthographic projection of the conductive layer 125 on the base substrate 105 coincides with a portion of the outer edge of the orthographic projection of the active layer 120 on the base substrate 105. Specifically, in an embodiment, the orthographic projection of conductive layer 125 on base substrate 105 comprises two rectangles. Each of the two rectangles has an edge opposite to each other. The two edges of the conductive layer corresponding to the two edges opposite to each other are the inner edges of the conductive layer. In a conductive layer, the edges other than the inner edge are the outer edges of the conductive layer. It should be understood that this coinciding of the orthographic projections means that the outer edge of the conductive layer 125 is aligned with the outer edge of the active layer 120 in the horizontal dimension. One way to achieve such an alignment is to select the material of the active layer 120 and the material of the conductive layer 125 such that the selected materials can be etched in the same etching process, i.e., a portion of the edges of the active layer 120 and the conductive layer 125 (e.g., the outer edges) can be formed in the same etching process. This covers, in particular, the case where the active material is different from the conductive material. More specifically, the selected active material and the selected conductive material may be etched by the same etching material (e.g., the etchant). In an embodiment, the active material may comprise, for example, IGZO or ITZO, and the conductive material may comprise ITO or IZO. The etchant may comprise, for example, various concentrations of hydrochloric acid, sulfuric acid, phosphoric acid, glacial acetic acid, hydrogen peroxide, and the like. It should be understood that other suitable combinations of active material, conductive material, and etchant are also suitable.

In another embodiment, the conductive layer 125 is continuously disposed on the upper surface and side surfaces of the active layer 120. In this case, the orthographic projection of the conductive layer 125 on the base substrate 105 partially covers the outer edge of the orthographic projection of the active layer 120 on the base substrate 105.

The thin film transistor 100 according to an embodiment of the present disclosure further comprises a gate 135. In the embodiment shown in FIG. 1, an active layer 120, a conductive layer 125, a gate 135, and a source/drain 145, 150 are sequentially disposed in the thin film transistor 100 in a direction away from the base substrate 105. That is, the thin film transistor 100 shown in FIG. 1 is a top gate thin film transistor. Since the top gate thin film transistor has a better performance than the bottom gate thin film transistor, including smaller parasitic capacitance, larger on-state current, smaller sub-threshold swing, and higher stability, etc., the top gate thin film transistor has been widely used. However, the thin film transistor according to an embodiment of the present disclosure may also be a bottom gate thin film transistor (including a back channel etching type thin film transistor and an etch stop layer type thin film transistor), that is, in a direction away from the base substrate, a gate, an active layer, a conductive layer, and a source/drain are arranged sequentially in the thin film transistor.

According to an embodiment of the present disclosure, a gate insulating layer 130 may exist between the gate 135 and the active layer 120. As can be seen from FIG. 1, the conductive layer 125 comprises two parts that are respectively located at the two edges of the upper surface of the active layer 120. The gate insulating layer 130 is disposed to cover at least a portion of the surface of the conductive layer 125 and cover the part of the surface of the active layer 120 that is not covered by the conductive layer 125.

The thin film transistor 100 according to an embodiment of the present disclosure further comprises an interlayer insulating layer 140. Via holes 141 are formed in the interlayer insulating layer 140. The source/drain 145, 150 may be formed in the interlayer insulating layer 140 and connected to the conductive layer 125 through the via holes 141. A passivation layer 155 may also be formed on the source/drain 145, 150 and the interlayer insulating layer 140.

The thin film transistor 100 according to an embodiment of the present disclosure may further comprise a light shielding layer 110 disposed on the base substrate. The projection of the active layer 120 on the base substrate 105 falls within the projection of the light shielding layer 110 on the base substrate 105 to prevent the increase of dark current caused by light leakage. A buffer layer 115 may be deposited on the light shielding layer 110. The active layer 120 and other structures thereon and the interlayer insulating layer 140 are disposed on the buffer layer 115.

The thin film transistor according to an embodiment of the present disclosure comprises a conductive layer between the active layer and the source/drain, so that the active layer is not required to be converted into an electrically conductive region, thereby overcoming the problem of the uniformity of the gate threshold voltage $V_{th}$ caused by the inconsistency of the channel length. In addition, the fact that the active layer and a part of the conductor layer are formed in the same etching process simplifies the manufacturing process of the thin film transistor.

The present disclosure also provides a method for manufacturing a thin film transistor. FIG. 2 shows a flow chart of the method 200 for manufacturing the thin film transistor. The method 200 comprises the following steps:

Step S205, forming an active material layer and forming a conductive material layer on the active material layer, step S210, coating a photoresist on the conductive material layer, Step S215, exposing and developing the photoresist by means of a halftone mask, such that the photoresist is divided into a photoresist completely-removed region, a photoresist completely-retained region, and a photoresist partially-retained region, Step S220, removing a segment of the active material layer and a segment of the conductive material layer corresponding to the photoresist completely-removed region by a same etching process, to form a stack of an active layer and a patterned conductive material layer, Step S225, partially removing the photoresist in the photoresist completely-retained region and completely removing the photoresist in the photoresist partially-retained region, and Step S230, removing a segment of the conductive material layer corresponding to the photoresist partially-retained region, to form a conductive layer.

The method 200 is described in detail below in conjunction with the drawings.

Before performing the step S205, a base substrate 105 is provided first, and a light shielding layer 110 is provided on the base substrate 105. The base substrate 105 may be a glass substrate, a plastic substrate or an insulating substrate. The base substrate 105 can be transparent. The base substrate 105 needs to be cleaned. The cleaning of the base substrate may comprise the following steps: soaking in the dilute acid, washing in the deionized water, ultrasonic cleaning with acetone and ethanol, etc. The base substrate can then be dried with nitrogen. Although the active material has a high transmittance for visible light, the characteristics if the thin film transistor device will degrade under illumination conditions. Providing a light shielding layer can effectively reduce the effect of light on the thin film transistor, especially the oxide active layer. In an embodiment, the light shielding layer may be formed by a patterning process.

After the light shielding layer 110 is formed, a buffer layer 115 is deposited on the light shielding layer 110. The buffer layer 115 serves to buffer stress generated during the process of manufacturing other structures of the thin film transistor on the base substrate 105 to prevent the base substrate 105 from being damaged or broken. Therefore, after the thin film transistor is formed, the active layer 120, the source/drain 145, 150, and the conductive layer 125 are stacked on the base substrate 105 through the buffer layer 115. The material of the buffer layer 115 could be any one of silicon oxide, silicon nitride, silicon oxynitride or a combination thereof. FIG. 3 schematically shows a base substrate with a light shielding layer 110 and a buffer layer 115 have been formed thereon.

After the buffer layer 115 being formed, an active material layer 119 is formed on the base substrate 105 and a conductive material layer 124 is formed on the active material layer 119 (step S205). The active material layer 119 is a layer of active material overlying the buffer layer 115, and the conductive material layer 124 is a layer of conductive material overlying the layer of active material. The work function of the active material should match the work function of the conductive material, for example be close to each other, in order to form an ohmic contact between the two materials. In an embodiment, the active material layer 119 and the conductive material layer 124 are sequentially and continuously deposited on the base substrate 105 on which the buffer layer 115 has been formed. In an embodiment, the active material and the conductive material are selected as two different materials such that the two different materials can be etched by the same etching material. Thus, in a subsequent process, portions of the active material layer 119 and conductive material layer 124 can be etched away in the same etch process. For example, IGZO or ITZO can be selected as the active material, and ITO or IZO can be selected as the conductive material. The etching process will be described in detail later.

Figure 4:
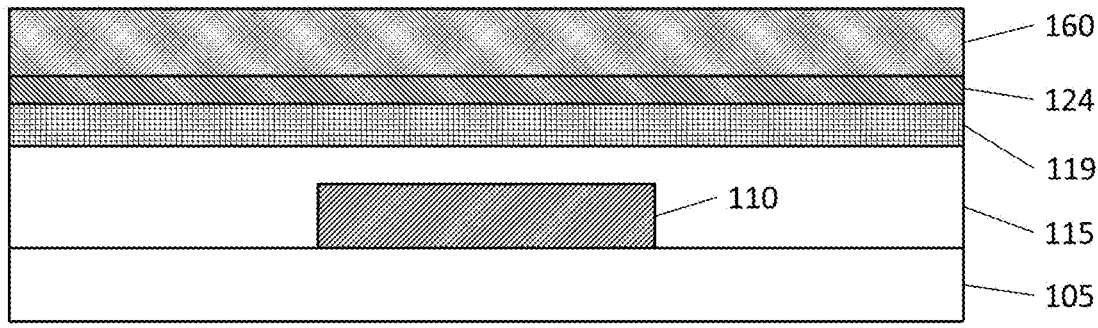

After the active material layer 119 and the conductive material layer 124 are formed, a layer of photoresist 160 is coated on the conductive material layer 124 (step S210). In an embodiment, the method of coating the photoresist may be spin coating, screen printing, roll coating, or the like. After the photoresist 160 is coated, the photoresist 160 may need to be prebaked. FIG. 4 shows a base substrate 105 in which an active material layer 119 and a conductive material layer 124 have been disposed and a photoresist 160 has been applied.

Figure 5:
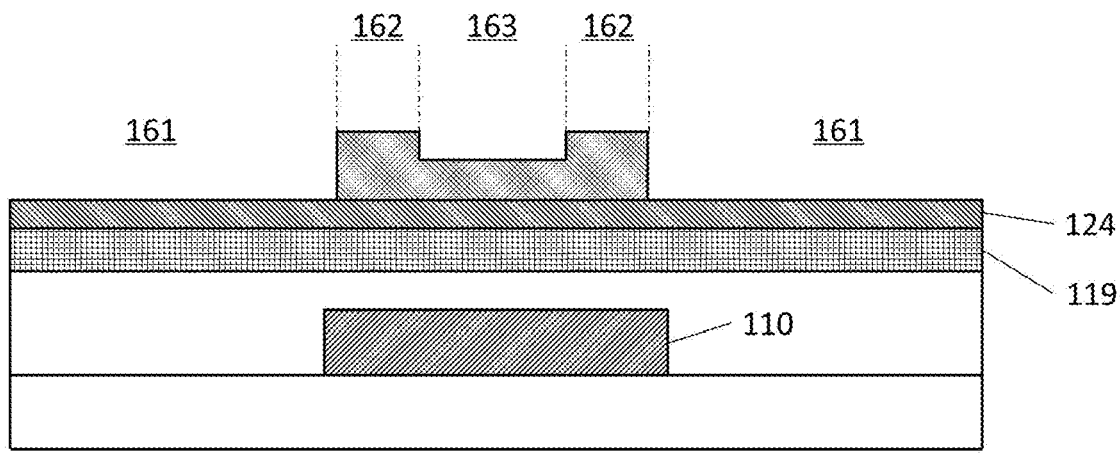

After the photoresist 160 is formed, the photoresist is exposed and developed by a halftone mask, so that the photoresist is divided into a photoresist completely-removed region 161, a photoresist completely-retained region 162, and a photoresist partially-retained region 163 (step S215). The halftone mask utilizes the partial light transmittance of the grating to control the dose of light reaching the photoresist so that portions of the photoresist are exposed to different degrees of exposure. In an embodiment, the halftone mask used in the method for manufacturing a thin film transistor according to the present disclosure comprises three regions—a completely transparent region, a completely opaque region, and a partially transparent region. Correspondingly, after the photoresist 160 is irradiated through a halftone mask plate with a specific light (for example, ultraviolet light), the photoresist will comprise three regions—the photoresist completely-removed region 161, the photoresist-completely-retained-region 162 and the photoresist partially-retained region 163. The photoresist completely-removed region 161 refers to a region where the photoresist is completely removed after development. The photoresist completely-retained region 162 refers to a region where the photoresist is not removed after the development. The photoresist partially-retained region 163 refers to a region where the photoresist is partially removed after the development in a direction away from the base substrate. After being partially removed, the remaining photoresist in the photoresist partially-retained region 163 has a thickness lower than the thickness of the photoresist in the photoresist completely-retained region 162. In the method, the pattern of the photoresist completely-retained region 162 corresponds to the pattern of the conductive layer 125. The combination of the pattern of the photoresist completely-retained region 162 and the pattern of the photoresist partially-retained region 163 corresponds to the pattern of the active layer 120. FIG. 5 schematically shows a cross-sectional view of a developed photoresist 160.

Figure 6:
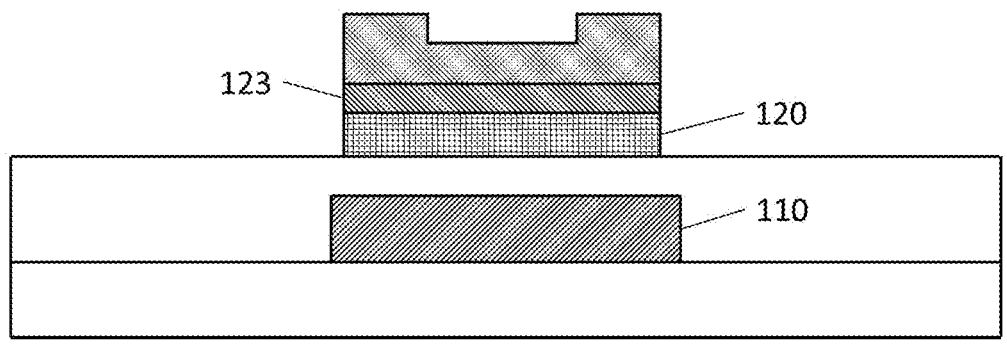

After the photoresist 160 is developed, a segment of the active material layer 119 and a segment of the conductive material layer 124 corresponding to the photoresist completely-removed region 161 are removed by the same etching process to form a stack of the active layer 120 and the conductive layer that has been patterned for the first time (step S220). Since the active material and the conductive material have been selected to be etched by the same etching solution as described above, the active material layer 119 and the conductive material layer 124 can be etched in the same etching process. This reduces the number of processes and is beneficial for large-scale production. The term "corresponding" means that the orthographic projections of the two structures on the base substrate 105 substantially coincide, i.e., the edges of the two structures are aligned in a direction perpendicular to the base substrate 105. In this step, the segment of the active material layer 119 and the segment of the conductive material layer 124 corresponding to the photoresist completely-removed region 161 are etched away. After removing the segments of the active material layer 119 and the conductive material layer 124 corresponding to the photoresist completely-removed region 161, a pattern of the active material layer (i.e., the active layer 120) is formed, and an outer edge of the conductive layer 125 is formed, and the outer edge of the active layer 120 is aligned with the outer edge of the conductive layer 125. In an embodiment, the etching process is a wet etching process. FIG. 6 shows the active layer 120 and the conductive material layer patterned for the first time 123, which are formed by step S220.

Figure 7:
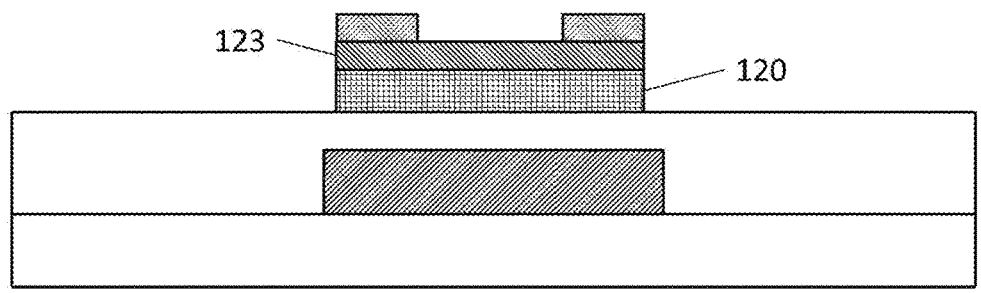

After the active material layer 119 and the conductive material layer 124 are etched, the photoresist in the photoresist completely-retained region 162 is partially removed, and the photoresist in the photoresist partially-retained region 163 is completely removed (step S225). In this step, the photoresist completely-retained region 162 and the photoresist partially-retained region 163 are exposed using a dose of ultraviolet light. The exposure dose of the ultraviolet light is configured such that after exposure and development, the photoresist in the photoresist completely-retained region 162 is partially thinned, and the photoresist in the photoresist partially-retained region 163 is completely removed. The exposure dose refers to the sum of the ultraviolet light absorbed by the photoresist, which is a function of the intensity of the light emitted by the exposure lamp and the exposure time. By controlling these two factors, the exposure dose can be controlled to control the amount of photoresist retaining on the conductive material layer. Since the photoresist in the photoresist partially-retained region 163 is completely removed, the conductive material layer patterned for the first time 123 is exposed, which can be etched away in a subsequent step. Because the photoresist in the photoresist completely-retained region 162 is partially thinned, that is, the photoresist in the region still exists, it can continue to prevent the conductive material layer patterned for the first time 123 covered by it from being etched in the subsequent process. FIG. 7 shows a cross-sectional view of the base substrate 105, the active layer 120, the conductive material layer patterned for the first time 123 and the photoresist after the photoresist in the photoresist completely-retained region 162 is partially removed and the photoresist in the photoresist partially-retained region 163 is completely removed.

Figure 8:
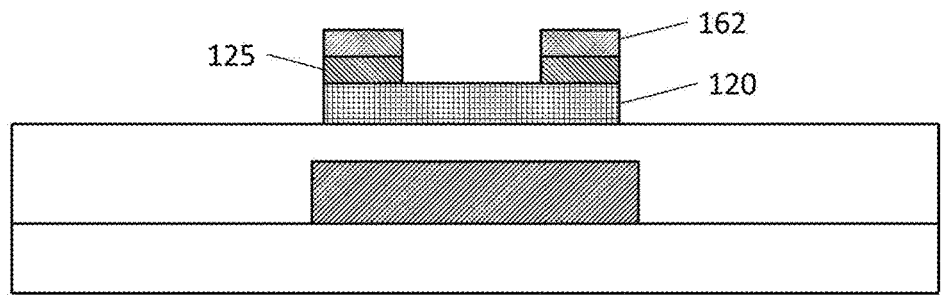
Figure 9:
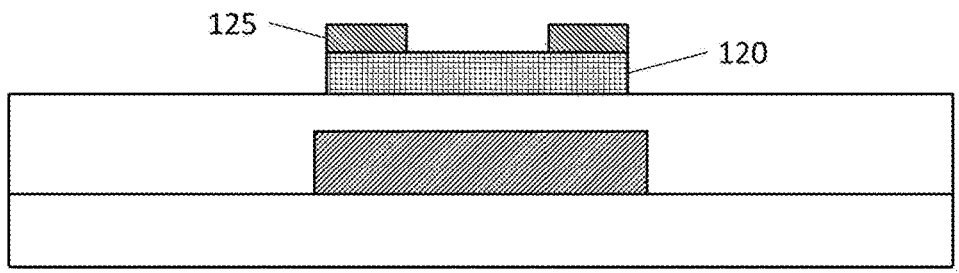

After the photoresist in the photoresist completely-retained region 162 and the photoresist in the photoresist partially-retained region 163 are removed to different degrees, the segment of the conductive material corresponding to the photoresist partially-retained region 162 is removed to form the conductive layer 125 (step S230). The conductive layer 125 is the patterned conductive material layer 124. At this time, the patterning of the active material layer 119 and the conductive material layer 124 is completed, that is, both the active layer 120 and the conductive layer 125 have been formed. In an embodiment, the conductive material may be etched by using a wet etching process. In an embodiment, the conductive material may be etched by the same process as the etching process used in step S220. More specifically, steps S220 and S230 can be performed using the same etching material. FIG. 8 shows the conductive layer 125, the active layer 120, and the photoresist on the conductive layer 125. The photoresist in the photoresist completely-retained region 162 can then be removed, i.e., the photoresist on the conductive layer 125 is removed. In this step, the photoresist on the conductive layer 125 can be removed by the same process as step S220. FIG. 9 shows the conductive layer 125 and the active layer 120 after the photoresist on the conductive layer 125 is removed.

Figure 10:
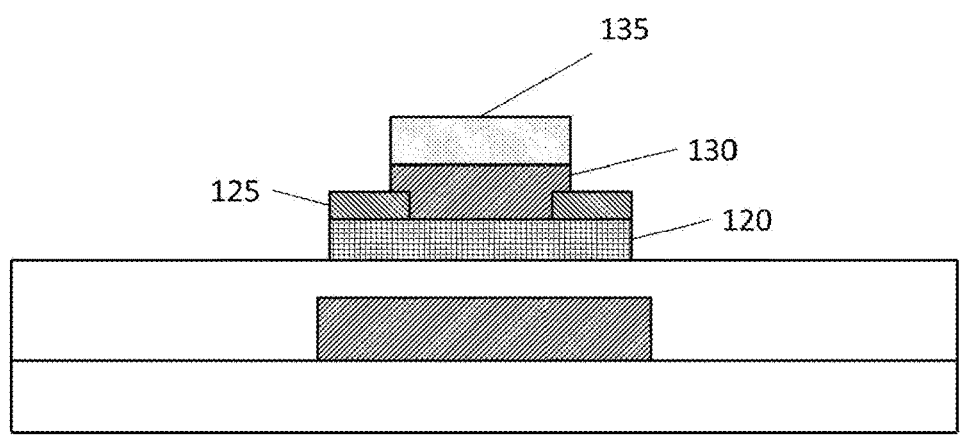

After the active layer 120 and the conductive layer 125 have been formed, the gate insulating layer 130 and the gate 135 are formed on the above structure. In an embodiment, the pattern of gate 135 is formed using a wet patterning process, and then the pattern of gate insulating layer 130 is formed using a dry patterning process. In an embodiment, the gate insulating layer 130 covers not only a portion of the active layer 120 not covered by the conductive layer 125, but also a portion of the conductive layer 125. FIG. 10 shows the structure of such an embodiment. This structure prevents the particle bombardment in the dry patterning process from converting a region of the active layer 120 into electrically conductive region. Subsequently, an interlayer insulating layer 140 is deposited on the above structure, and via holes 141 are formed in the interlayer insulating layer. Then, a source/drain metal layer is formed on the interlayer insulating layer 140, and the source/drain 145, 150 is formed by a patterning process. Finally, a passivation layer 155 can be formed on the interlayer insulating layer 140.

Since the conductive layer 125 is disposed above the edge portion of the active layer 120, and the work functions of the conductive material and the active material are relatively close, an ohmic contact can be formed, therefore, there is no need to convert the active layer 120 into electrically conductive region, thereby overcoming the problem of the uniformity of the gate threshold voltage $V_{th}$ caused by the inconsistency of the channel length. In addition, because the halftone mask is used, the active material layer 119 and the conductive material layer 124 can be etched in the same etching process. This reduces the number of processes and reduces the complicity of the process.

The present disclosure also provides an array substrate comprising the thin film transistor according to any of the embodiments of the present disclosure. The present disclosure further provides a display panel comprising the array substrate according to any of the embodiments of the present disclosure.

To sum up, the present disclosure provides a thin film transistor, comprising a base substrate, an active layer and a source/drain arranged on the base substrate, and a conductive layer arranged directly on the active layer and electrically connected to the source/drain, wherein the active layer and an outer edge of the conductive layer are formed in a same etching process. The present disclosure further provides a method for manufacturing a thin film transistor, comprising the steps of: —forming an active material layer, and forming a conductive material layer on the active material layer, —forming a photoresist on the conductive material layer, —exposing and developing the photoresist by means of a halftone mask such that the photoresist is divided into a photoresist completely-removed region, a photoresist completely-retained region, and a photoresist partially-retained region, —removing a segment of the active material layer and a segment of the conductive material layer corresponding to the photoresist completely-removed region by a same etching process, to form a stack of an active layer and a patterned conductive material layer, —partially removing the photoresist in the photoresist completely-retained region and completely removing the photoresist in the photoresist partially-retained region, and—removing a segment of the conductive material layer corresponding to the photoresist partially-retained region, to form a conductive layer.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

It should also be understood that, unless clearly indicated to the contrary, in any methods claimed herein that include more than one step or act, the order of the steps or acts of the method is not necessarily limited to the order in which the steps or acts of the method are recited. Also, any reference numerals or other characters, appearing between parentheses in the claims, are provided merely for convenience and are not intended to limit the claims in any way.

What is claimed is:

1. A method for manufacturing a thin film transistor, comprising:
    forming an active material layer, and forming a conductive material layer on the active material layer;
    forming a photoresist on the conductive material layer;
    exposing and developing the photoresist using a halftone mask such that the photoresist is divided into a photoresist completely-removed region, a photoresist completely-retained region, and a photoresist partially-retained region;
    removing a segment of the active material layer and a segment of the conductive material layer corresponding to the photoresist completely-removed region by a same etching process to form a stack of an active layer and a patterned conductive material layer;
    partially removing the photoresist in the photoresist completely-retained region and completely removing the photoresist in the photoresist partially-retained region;
    removing a segment of the conductive material layer corresponding to the photoresist partially-retained region, to form a conductive layer; and
    forming a source/drain on a side of the conductive layer away from the active layer,
    wherein the source/drain is electrically connected to the active layer through the conductive layer.

2. The method for manufacturing the thin film transistor of claim 1, wherein the removing the segment of the active material layer and the segment of the conductive material layer comprises:
    etching the segment of the active material layer and the segment of the conductive material layer corresponding to the photoresist completely-removed region by a wet etching process.

3. The method for manufacturing the thin film transistor of claim 1, wherein the removing the segment of the active material layer and the segment of the conductive material layer comprises:
    etching the active material layer and the conductive material layer by using a same etching solution.

4. The method for manufacturing the thin film transistor of claim 1,
    wherein an active material comprised by the active material layer comprises IGZO or ITZO, and
    wherein a conductive material comprised by the conductive material layer comprises ITO or IZO.

5. The method for manufacturing the thin film transistor of claim 1, wherein the partially removing the photoresist in the photoresist completely-retained region and completely removing the photoresist in the photoresist partially-retained region comprises:
    illuminating and developing the photoresist completely-retained region and the photoresist partially-retained region, such that the photoresist in the photoresist partially-retained region is completely removed and the photoresist in the photoresist completely-retained region is partially removed in a direction perpendicular to the active material layer.

6. The method for manufacturing the thin film transistor of claim 1, wherein the removing the segment of the conductive material layer corresponding to the photoresist partially-retained region to form the conductive layer comprises:
    etching the segment of the conductive material layer corresponding to the photoresist partially-retained region by a wet etching process.

7. The method for manufacturing the thin film transistor of claim 1, wherein the removing the segment of the active material layer and the segment of the conductive material layer corresponding to the photoresist completely-removed region by the same etching process to form the stack of the active layer and the patterned conductive material layer and the step of removing the segment of the conductive material layer corresponding to the photoresist partially-retained region to form the conductive layer use a same etching material.

8. The method for manufacturing the thin film transistor of claim 1, further comprising:
   removing the photoresist in the photoresist completely-retained region.

* * * * *